United States Patent [19]
Murai

[11] Patent Number: 6,138,267
[45] Date of Patent: Oct. 24, 2000

[54] RELIABILITY VERIFICATION DEVICE FOR DETECTING PORTION OF DESIGN THAT MAY CAUSE MALFUNCTION OF SEMICONDUCTOR INTEGRATED CIRCUIT AND ITS VERIFYING METHOD

[75] Inventor: Syuzo Murai, Tokyo, Japan

[73] Assignee: NEC Corporation, Tokyo, Japan

[21] Appl. No.: 09/135,055

[22] Filed: Aug. 18, 1998

[30] Foreign Application Priority Data

Aug. 18, 1997 [JP] Japan ................................ 9-236578

[51] Int. Cl.[7] .......................... G06F 17/50; G06F 17/10
[52] U.S. Cl. ................................ 716/5; 703/4; 703/19
[58] Field of Search .................... 325/500.02, 500.19, 325/500.35, 500.36, 500.37; 716/1–21; 703/14–16

[56] References Cited

U.S. PATENT DOCUMENTS

| | | | |
|---|---|---|---|
| 5,305,299 | 4/1994 | Dhar | 703/14 |
| 5,481,484 | 1/1996 | Ogawa et al. | 703/14 |
| 5,535,133 | 7/1996 | Petschauer et al. | 716/19 |
| 5,553,008 | 9/1996 | Huang et al. | 703/14 |
| 5,568,395 | 10/1996 | Huang | 716/4 |
| 5,596,506 | 1/1997 | Petschauer et al. | 716/5 |
| 5,724,250 | 3/1998 | Kerzman et al. | 716/3 |
| 5,726,903 | 3/1998 | Kerzman et al. | 716/2 |
| 5,845,233 | 12/1998 | Fishburn | 702/108 |
| 5,872,952 | 2/1999 | Tuan et al. | 703/14 |
| 5,882,214 | 10/1998 | Rostoker et al. | 716/10 |
| 5,923,569 | 7/1999 | Kumashiro et al. | 716/7 |
| 5,946,475 | 8/1999 | Burks et al. | 716/6 |
| 5,999,726 | 12/1999 | Ho | 716/11 |
| 6,029,117 | 2/2000 | Devgan | 702/58 |
| 6,035,111 | 3/2000 | Suzuki et al. | 716/11 |

OTHER PUBLICATIONS

Lee et al., "Test generation for crosstalk effects in VLSI circuits", 1996 IEEE International Symposium on Circuits and Systems, 1996, ISCAS '96, Connecting the World, vol. 4, May 12, 1996, pp. 628–631.

Fourniols et al., "Measurement techniques for coupling characterization inside CMOS integrated circuits", IEEE International Symposium on Electromagnetic Compatibility, 1994, Symposium Record, Compatibility in the Loop, Aug. 22, 1994, pp. 22–26.

"ASIC Design Handbook", 1989, Science Forum Co., Ltd., pp. 179–182, Jan. 1989.

"LSI Design and Manufacturing Techniques," 1987, Denki Shoin Co., Ltd. pp. 142–147, Jan. 1987.

*Primary Examiner*—Paul R. Lintz
*Assistant Examiner*—Phallaka Kik
*Attorney, Agent, or Firm*—McGinn & Gibb, P.C.

[57] ABSTRACT

A semiconductor integrated circuit reliability verification device for detecting any portion of design that may cause circuit malfunction due to the effects of switching noise, comprises a partial circuit network detecting part for detecting, based on a transistor-level net list for the circuit to be verified, information concerning partial circuit networks that form part of a circuit to be verified, a maximum resistance calculating part for calculating, based on the information concerning the partial circuit network, the maximum resistance that occurs while the channel connected component is operating, a gate capacitance calculating part for calculating, based on the information concerning the partial circuit network, the total gate capacitance for the portions but the inverter of a driven circuit, and an error judging part for calculating the value of evaluation function, based on the value of maximum resistance and the total gate capacitance, and judging whether or not the calculated value is in violation of the design criteria.

15 Claims, 10 Drawing Sheets

RELIABILITY VERIFICATION DEVICE FOR DETECTING PORTION OF DESIGN THAT MAY CAUSE MALFUNCTION OF SEMICONDUCTOR INTEGRATED CIRCUIT AND ITS VERIFYING METHOD

BACKGROUNDS OF THE INVENTION

1. Field of the Invention

The present invention relates to a semiconductor integrated circuit reliability verification device for examining transistor-level design information on a synchronous circuit (for instance, a synchronous circuit of CMOS (Complementary Metal Oxide Semiconductor)) to detect any portion of the design that may cause circuit malfunction due to the effects of switching noise and its verifying method.

2. Description of the Related Art

Figure 11:
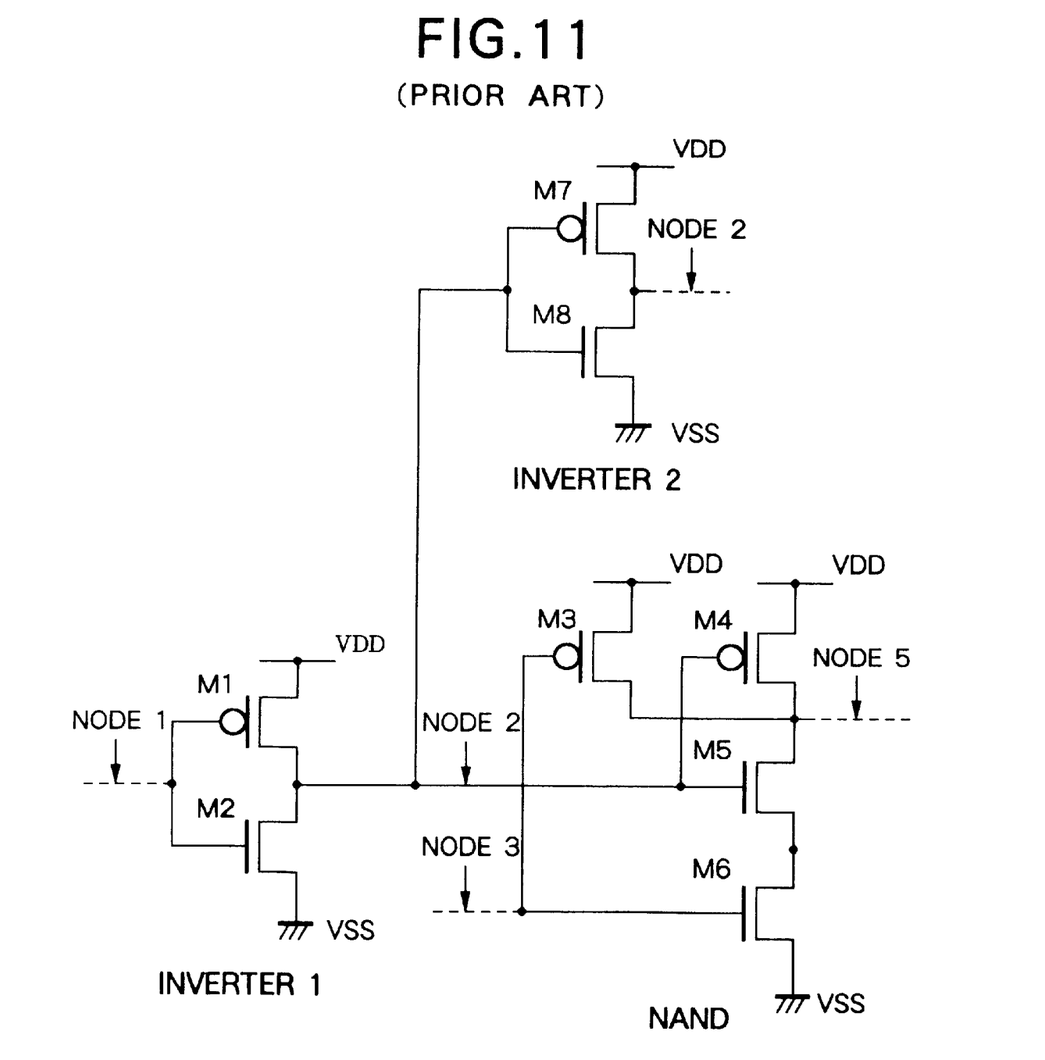
FIG. 11 is a circuit diagram showing an example of circuit configuration in which switching noise occurs.
Figure 12:
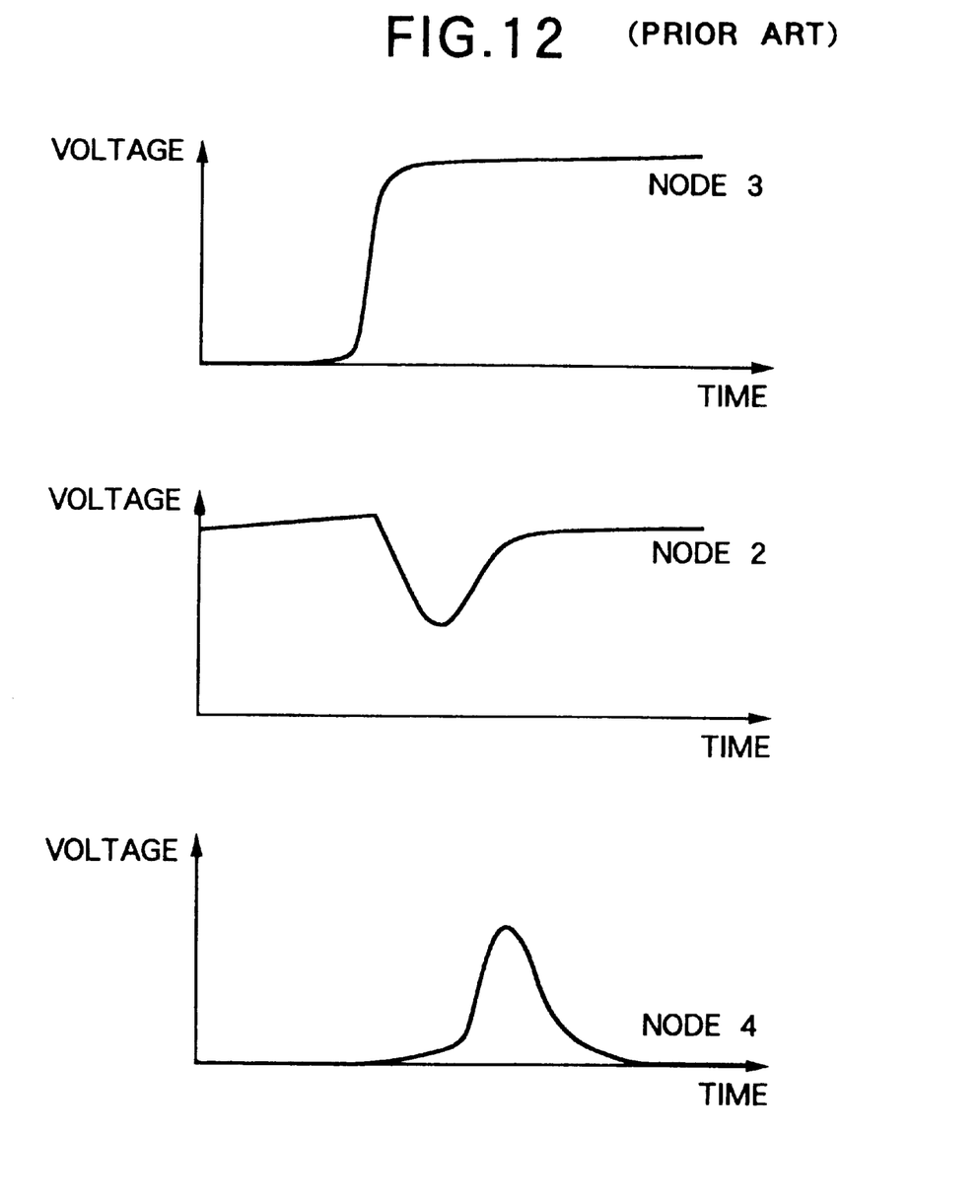
FIG. 12 is a time chart showing the generation of switching noise.

First, switching noise will be described. FIG. 11 is a circuit diagram showing an example of semiconductor integrated circuit to be verified. FIG. 12 is a time chart showing output signals of Nodes 2, 3, and 4 of the circuit shown in FIG. 11.

The case where the signal level at Node 2 is high, and the signal of Node 3 rises is assumed here. At this point, Transistor M6 turns on and Transistor M3 turns off. This causes the signal of Node 5, which is the output of the NAND gate, to fall. Then, the drain of Transistor M4, the drain of Transistor M5, and the voltage of the source decrease, causing a current to flow into the gates of Transistors M4 and M5. This phenomenon is caused by the gate-to-drain capacitance and the gate-to-source capacitance.

When the gate capacitance for Transistors M4 and M5 are large and the output resistance of Inverter 1 is also large, the current that flows into Transistors M4 and M5 causes the voltage at Node 2 to decrease, as shown in FIG. 12. This is switching noise, and its effects propagate to Node 4. This switching noise further affects the propagation delay time for the path Node 1-Node 2-Node 4, causing the semiconductor integrated circuit to malfunction.

In conventional practices, the reliability of a semiconductor integrated circuit against switching noise is conducted during the design phase of a semiconductor integrated circuit. During this phase, the semiconductor integrated circuit is simulated, using a circuit simulator, for its behavior under the influence of switching noise, and the results thus obtained are reflected in the design of the circuit so that it will not malfunction due to switching noise.

Conventional methods for verifying the reliability of a semiconductor integrated circuit against switching noise are disclosed, for example, in a literature titled "ASIC Design Handbook," 1989, Science Forum Co., Ltd., pp. 179–182, and a literature titled "LSI Design and Manufacturing Techniques," 1987, Denki Shoin Co., Ltd., pp. 142–147.

According to the said literatures, the conventional method for verifying the reliability of a semiconductor integrated circuit against switching noise first gives a test pattern to the input terminal of the semiconductor integrated circuit, and performs a simulation by taking the generation of switching noise into account. The method then verifies whether the value of output at the output terminal of the semiconductor integrated circuit is equal to an expected value, i.e., a value that is obtained at normal times. If the value of the output signal is not equal to the expected value, it means that the logic state of the circuit has changed due to the effects of switching noise. In this case, the designer identifies the portion of the semiconductor integrated circuit that may have caused switching noise to generate, based on the test used for simulation and modifies the design as necessary so that malfunction due to switching noise may be prevented.

In the said conventional methods for verifying the reliability of a semiconductor integrated circuit against switching noise, however, the designer must first determine possible portions of a semiconductor integrated circuit in which switching noise may occur and verify the portion individually by use of the circuit simulator. This leads to a drawback that a massive amount of time and labor is required when attempting to conduct comprehensive verification on a large-scale semiconductor integrated circuit, making such attempt virtually impractical.

In addition, even if the verification procedure has been performed successfully, there always remains a possibility that switching noise occurs at an unexpected portion and causes the semiconductor integrated circuit to malfunction.

SUMMARY OF THE INVENTION

An object of the present invention is to provide an accurate and reliable verification device and a verification method that enable the designer of a large-scale semiconductor integrated circuit to detect portions of design that may cause malfunction due to switching noise both quickly and comprehensively.

Another object of the present invention is to provide a verification device and a verification method that can decrease labor required for the verification procedure by creating a test pattern to use on design information and thereby allowing the designer to omit the procedure for setting expected values for the design.

According to the first aspect of the invention, a semiconductor integrated circuit reliability verification device for examining transistor-level design information on a synchronous circuit of CMOS to detect any portion of the design that may cause circuit malfunction due to the effects of switching noise, comprises partial circuit network detecting means for detecting information concerning partial circuit networks that form part of a circuit to be verified, based on information equivalent to a transistor-level net list for the circuit to be verified, maximum resistance calculating means for calculating the maximum resistance that occurs while the channel connected component, which is the driver, is operating, based on the information concerning the partial circuit network detected by the partial circuit network detecting means, gate capacitance calculating means for calculating the total gate capacitance for the portions but the inverter of a driven circuit driven by the driver, based on the information concerning the partial circuit network detected by the partial circuit network detecting means, and error judging means for calculating the value of evaluation function, based on the value of maximum resistance calculated by the maximum resistance calculating means and the total gate capacitance calculated by the gate capacitance calculating means, and judging whether or not the calculated value is in violation of the pre-established design criteria.

In the preferred construction, the partial circuit network detecting means at least detects from design information on the verified circuit, as information concerning a partial circuit network, information concerning connection relationship between transistors that form the channel connected component and transistors that form the circuit portion but the inverter of the driven circuit as well as concerning parasitic resistances on the wiring that connects such transistors.

In the preferred construction, the maximum resistance calculating means substitutes for resistances the transistors that form the channel connected component of the partial circuit network, and calculates the maximum value of resistance by synthesizing such resistances and the parasitic resistances on the wiring.

In another preferred construction, the partial circuit network detecting means at least detects from design information on the verified circuit, as information concerning a partial circuit network, information concerning connection relationship between transistors that form the channel connected component and transistors that form the circuit portion but the inverter of the driven circuit as well as concerning parasitic resistances on the wiring that connects such transistors, and the maximum resistance calculating means substitutes for resistances the transistors that form the channel connected component of the partial circuit network, and calculates the maximum value of resistance by synthesizing such resistances and the parasitic resistances on the wiring.

In another preferred construction, the circuit to be verified is a synchronous circuit of CMOS.

According to the second aspect of the invention, a semiconductor integrated circuit reliability verification method for examining transistor-level design information on a synchronous circuit of CMOS to detect any portion of the design that may cause circuit malfunction due to the effects of switching noise, comprising the steps of detecting information concerning partial circuit networks that form part of a circuit to be verified, based on information equivalent to a transistor-level net list for the circuit to be verified, calculating the maximum resistance that occurs while the channel connected component, which is the driver, is operating, based on the information concerning the partial circuit network thus detected, calculating the total gate capacitance for the portions but the inverter of a driven circuit driven by the driver, based on the information concerning the partial circuit network thus detected, and calculating the value of evaluation function, based on the value of maximum resistance and the total gate capacitance thus calculated, and judging whether or not the calculated value is in violation of the pre-established design criteria.

In the preferred construction, the partial circuit network detecting step at least detects from design information on the verified circuit, as information concerning a partial circuit network, information concerning connection relationship between transistors that form the channel connected component and transistors that form the circuit portion but the inverter of the driven circuit as well as concerning parasitic resistances on the wiring that connects such transistors.

In the preferred construction, the maximum resistance calculating step further comprising steps of substituting for resistances the transistors that form the channel connected component of the partial circuit network, and calculating the maximum value of resistance by synthesizing such resistances and the parasitic resistances on the wiring.

In another preferred construction, the partial circuit network detecting step at least detects from design information on the verified circuit, as information concerning a partial circuit network, information concerning connection relationship between transistors that form the channel connected component and transistors that form the circuit portion but the inverter of the driven circuit as well as concerning parasitic resistances on the wiring that connects such transistors, and the maximum resistance calculating step further comprising steps of substituting for resistances the transistors that form the channel connected component of the partial circuit network, and calculating the maximum value of resistance by synthesizing such resistances and the parasitic resistances on the wiring.

According to another aspect of the invention, a computer readable memory storing a verification program that controls the operation of a semiconductor integrated circuit reliability verification device for examining transistor-level design information on a synchronous circuit of CMOS to detect any portion of the design that may cause circuit malfunction due to the effects of switching noise, wherein the verification program comprising the steps of detecting information concerning partial circuit networks that form part of a circuit to be verified, based on information equivalent to a transistor-level net list for the circuit to be verified, calculating the maximum resistance that occurs while the channel connected component, which is the driver, is operating, based on the information concerning the partial circuit network thus detected, calculating the total gate capacitance for the portions but the inverter of a driven circuit driven by the driver, based on the information concerning the partial circuit network thus detected, and calculating the value of evaluation function, based on the value of maximum resistance and the total gate capacitance thus calculated, and judging whether or not the calculated value is in violation of the pre-established design criteria.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
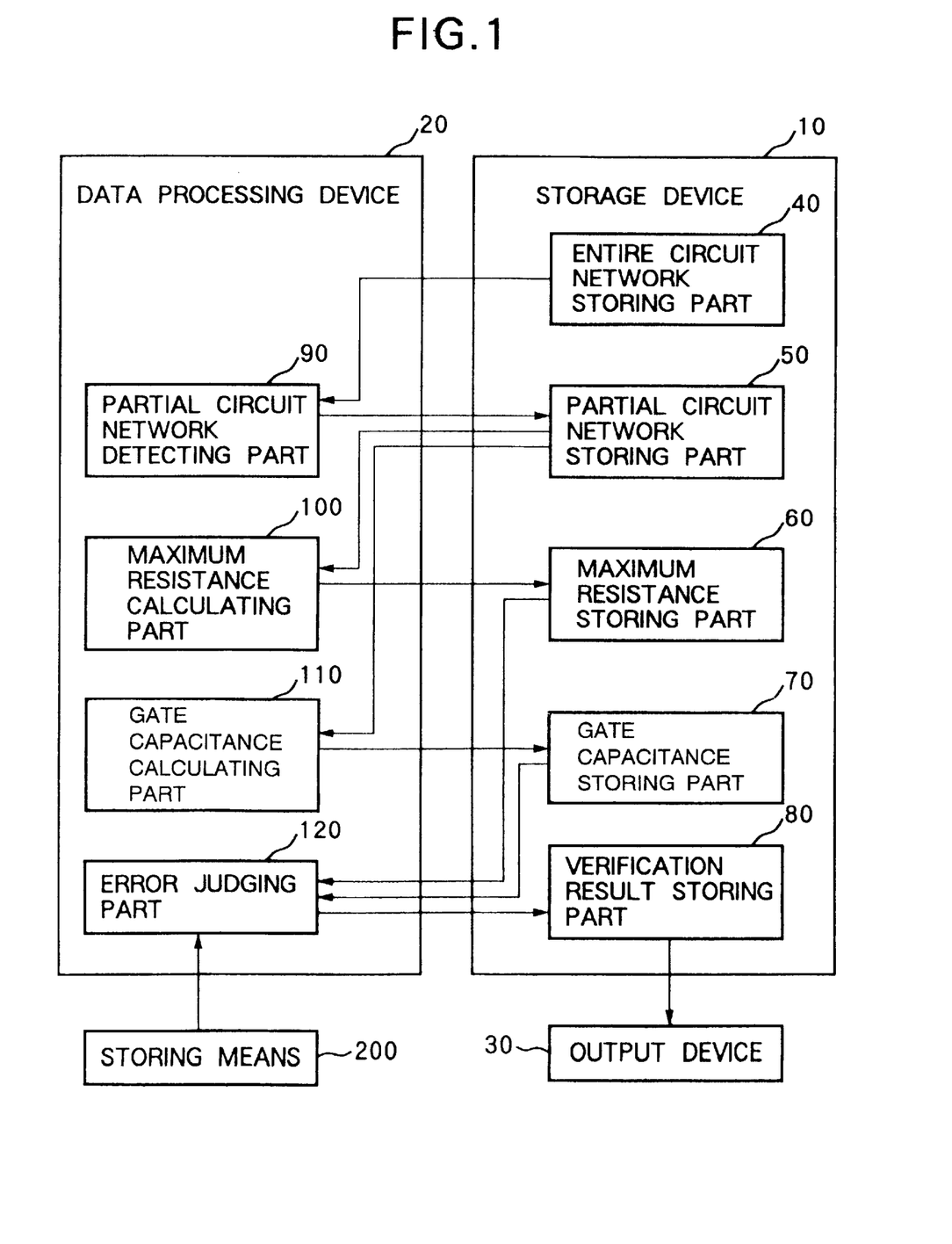
FIG. 1 is a block diagram showing the configuration of a reliability verification device according to one embodiment of the present invention.

FIG. 1 is a block diagram showing the configuration of a reliability verification device according to one embodiment of the present invention. With reference to FIG. 1, a reliability verification device according to the present embodiment includes a storage device 10 for storing various kinds of information required for processing, a data processing device 20 for performing various kinds of processes required under program control, and an output device 30 for outputting the results of verification. In FIG. 1, illustration is made only of a characteristic part of the configuration of the present embodiment but not of the remaining common part.

In the configuration described above, the storage device 10 is implemented using an RAM or other internal memory, or a magnetic disk device or other external storage device. The data processing device 20 is implemented using a CPU controlled by a computer program. The output device 30 is implemented using a display device or printer. The computer program for controlling the data processing device 20 (i.e., a verification program) is provided by being accommodated in a storage medium 200, as illustrated, and controls the execution of various kinds of processing by being loaded in the internal memory of the data processing device 20. For a storage medium 200, a magnetic disc, a semiconductor memory or other commonly used storage medium may be used.

In the said configuration, the storage device 10 includes an entire circuit network storing part 40, a partial circuit network storing part 50, a maximum resistance storing part 60, a gate capacitance storing part 70, and a verification results storing part 80.

The entire circuit network storing part 40 stores in advance information equivalent to an transistor-level net list for a semiconductor integrated circuit (for instance, a synchronous circuit of CMOS). In general, a transistor-level net list can be obtained from layout design data (a mask pattern), using LPE (Layout Parameter Extractor) or other software.

The partial circuit network storing part 50 stores information on a partial circuit network that consists of a circuit in which the transistor is channel-connected from VDD to VSS (a channel-connected component) and a circuit that is driven by such circuit (hereinafter referred to as a "driven circuit").

The maximum resistance storing part 60 stores information concerning maximum resistance that occurs while the channel-connected component, which is the driver of the partial circuit network, is operating.

The gate capacitance storing part 70 stores information concerning a total gate capacitance for all the portions but the inverter of the driven circuit of the detected partial circuit network.

The verification result storing part 80 stores information concerning the partial circuit network that is in violation of design criteria against switching noise and information concerning the value of evaluation function.

In the said configuration, the data processing device 20 includes a partial circuit network detecting part 90, a maximum resistance calculating part 100, a gate capacitance calculating part 110, and an error judging part 120.

The partial circuit network detecting part 90 extracts information on the partial circuit network, consisting of a channel-connected component and its driven circuit, from the design information on the semiconductor integrated circuit stored in the entire circuit network storing part 40, and stores it in the partial circuit network storing part 50.

The maximum resistance calculating part 100 calculates, from the information concerning the partial circuit network stored in the partial circuit network storing part 50, the maximum resistance that occurs while the channel connected component, which is the driver of the partial circuit network, is operating, and stores the resultant value of resistance in the maximum resistance storing part 60.

The gate capacitance calculating part 110 calculates, from the information concerning the partial circuit network stored in the partial circuit network storing part 50, the total gate capacitance for all the portions but the inverter of the driven circuit of the desired partial circuit network, and stores the resultant value of gate capacitance in the gate capacitance storing part 70.

The error judging part 120 calculates the value of evaluation function, based on the information concerning the maximum resistance stored in the maximum resistance storing part 60 and the information concerning the total gate capacitance stored in the gate capacitance storing part 70, and judges whether or not the calculated value of evaluation function is in violation of the design criteria against switching noise. If the calculated value is in violation of the design criteria, it stores the information concerning the same partial circuit network and the information concerning the value of evaluation function in the verification result storing part 80.

The output device 30 outputs the information, stored in the verification result storing part 80, concerning the partial circuit network that is in violation of the design criteria against switching noise and the information concerning the value of evaluation function.

Figure 2:
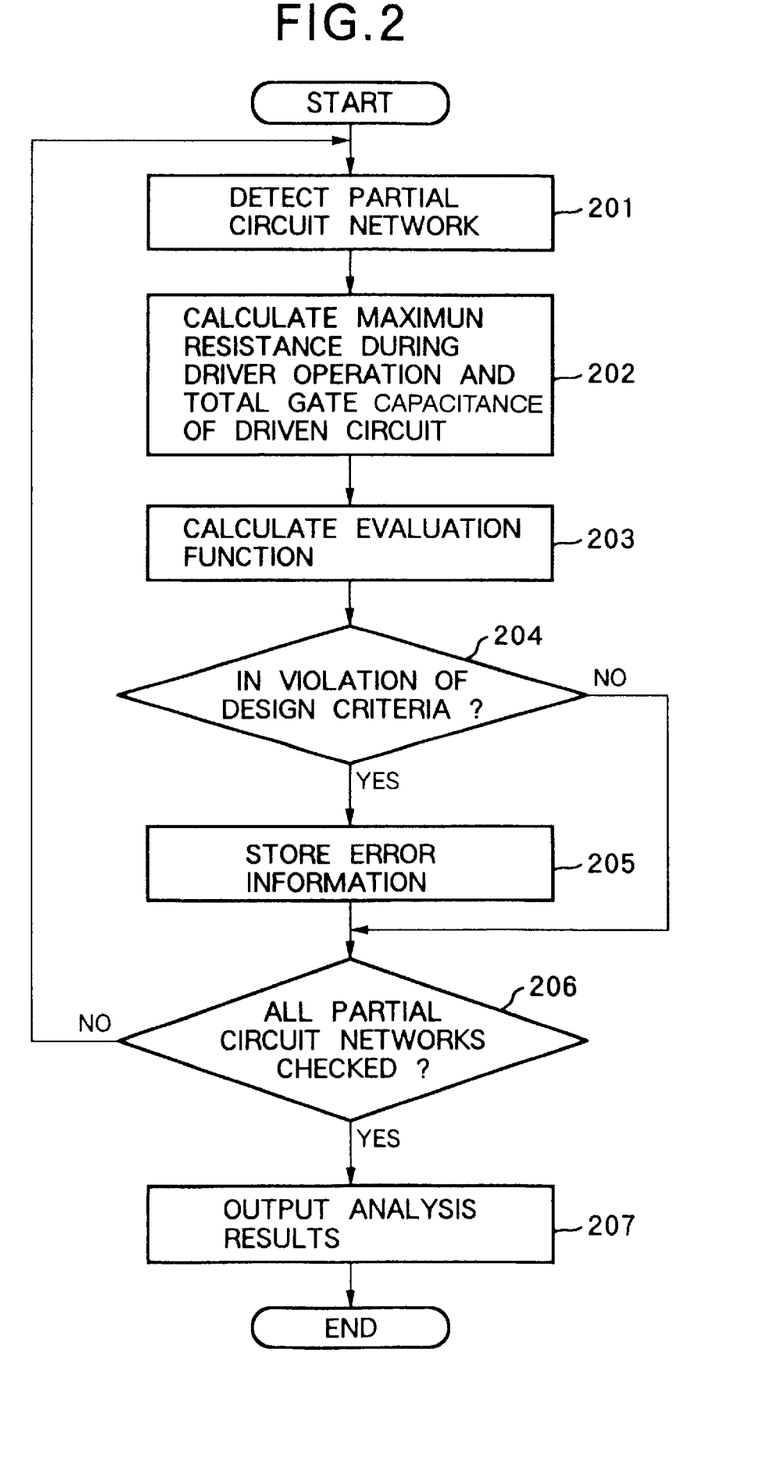
FIG. 2 is a flow chart showing the operation of the present embodiment.

Next, with reference to the flow chart in FIG. 2, the operation of the present embodiment will be described.

First, from the design information on the semiconductor integrated circuit to be verified stored in the entire circuit network storing part 40, the partial circuit network detecting part 90 of the data processing device 20 detects information on a partial circuit network, consisting of a channel-connected component and its driven circuit, and stores it in the partial circuit network storing part 50 (Step 201).

Next, from the information on the partial circuit network stored in the partial circuit network storing part 50, the maximum resistance calculating part 100 calculates the maximum resistance while a channel-connected component, which is the driver of the partial circuit network, is operating, and stores the resultant value of resistance in the maximum resistance storing part 60. Then, from the information on the partial circuit network stored in the partial circuit network storing part 50, the gate capacitance calculating part 110 calculates the total gate capacitance for all the portions but the inverter of the driven circuit of the desired partial circuit network, and stores the resultant value of gate capacitance in the gate capacitance storing part 70 (Step 202).

Next, the error judging part 120 calculates the value of evaluation function, based on the information concerning the maximum resistance stored in the maximum resistance storing part 60 and the information concerning the total gate capacitance stored in the gate capacitance storing part 70 (Step 203), and judges whether or not the calculated value of evaluation function is in violation of the design criteria against switching noise (Step 204). If the calculated value is in violation of the design criteria, it stores the information concerning the same partial circuit network and the information concerning the value of evaluation function in the verification result storing part 80 (Step 205).

Next, the error judging part 120 judges whether it has verified all the partial circuit networks to be verified. If there are any partial circuit networks yet to be verified, it returns to Step 201 (Step 206). When it has been ensured that all the partial circuit networks have been verified, the output device 30 outputs the information concerning the partial circuit network that is in violation of the design criteria against switching noise in the semiconductor integrated circuit and the information concerning the value of evaluation function that are stored in the verification result storing part 80 (Step 207).

Figure 3:
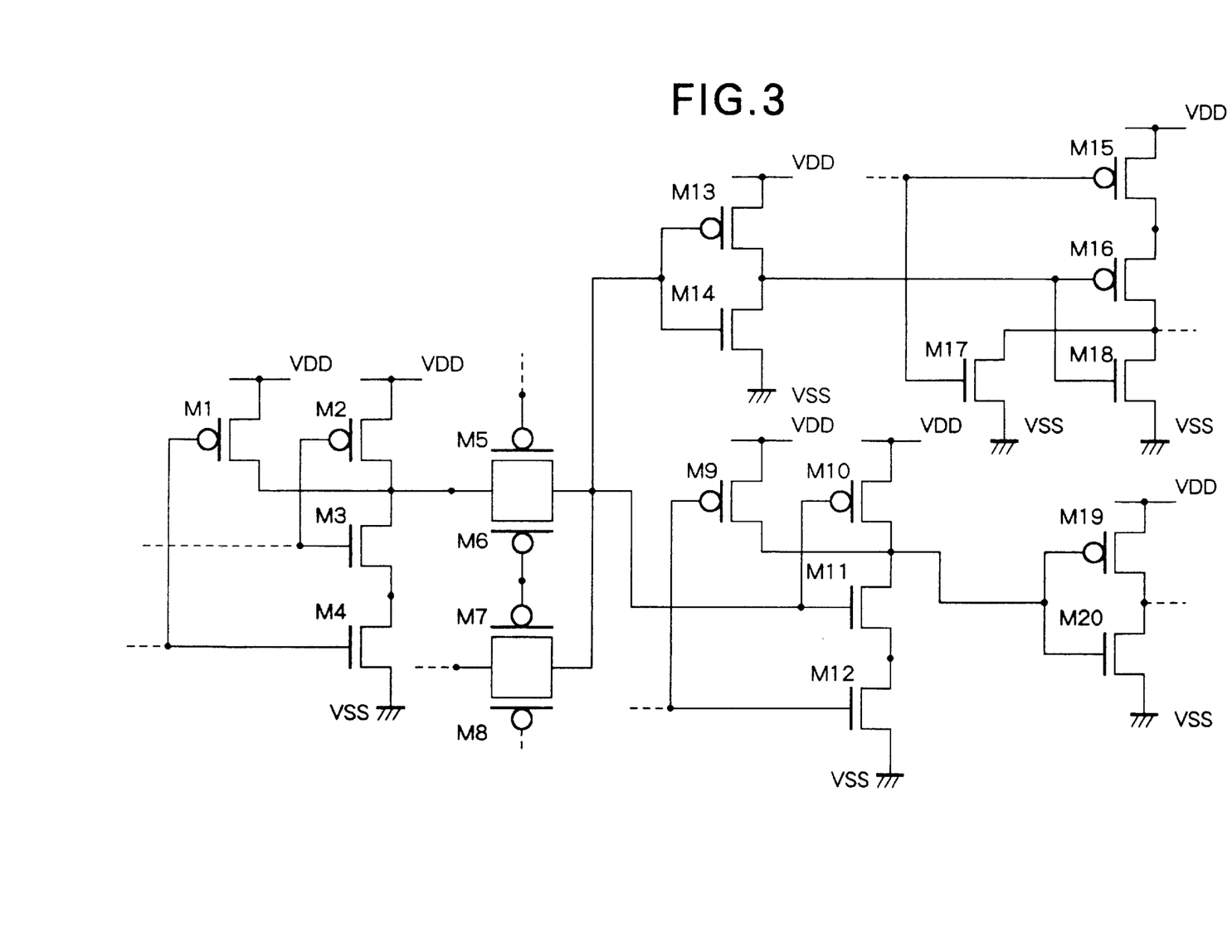
FIG. 3 is a circuit diagram showing the overall configuration of a semiconductor integrated circuit to be verified by the present embodiment.

Next, the operation on a specific semiconductor integrated circuit will be described. FIG. 3 is a circuit diagram showing the overall configuration of a semiconductor integrated circuit to be verified against switching noise by the present embodiment. With reference to FIG. 3, the semiconductor integrated circuit to be verified includes, as its channel-connected component, a NAND gate consisting of Transistors M1, M2, M3, and M4, and a transfer gate consisting of Transistors M5 and M6, another transfer gate consisting of Transistors M7 and M8, another NAND gate consisting of Transistors M9, M10, M11, and M12, an inverter consisting of Transistors M13 and M14, and a NOR gate consisting of Transistors M15, M16, M17, and M18, and another inverter consisting of Transistors M19 and M20. These pieces of information are initially stored in the entire circuit network storing part 40. It should be noted here that information concerning parasitic resistances on the wiring is also stored in the entire circuit network storing part 40, although FIG. 3 does not show them for practical reasons.

Figure 4:
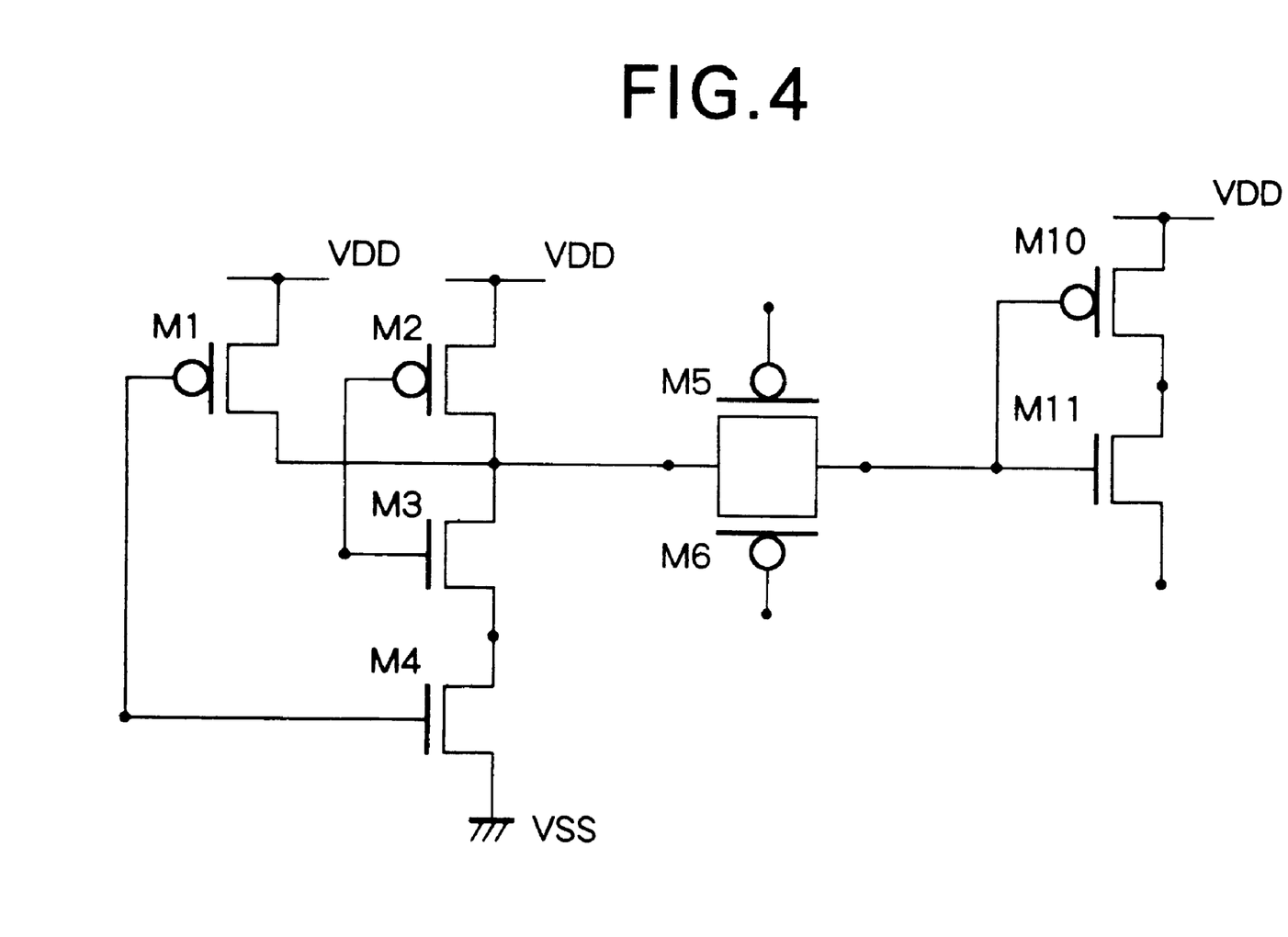
FIG. 4 is a circuit diagram showing the configuration of a partial circuit network extracted from the semiconductor integrated circuit shown in FIG. 3.

From information in the entire circuit network storing part 40, the partial circuit network detecting part 90 detects information concerning the connection relationship among a series of partial circuit networks, including a NAND gate which is the driver and consists of Transistors M1, M2, M3, and M4, Transistors M5 and M6 which form a transfer gate, and Transistors M10 and M11 which form the portion of a driven circuit excluding an inverter and are driven by the NAND gate, as well as information concerning parasitic resistances on the wiring connecting them, and stores the information in the partial circuit network storing part 50 (Step 201). FIG. 4 is a circuit diagram showing the configuration of a partial circuit network which is extracted from the semiconductor integrated circuit shown in FIG. 3 and stored in the partial circuit network storing part 50. As illustrated, extracted items are the NAND gate formed by Transistors M1, M2, M3, and M4, the transfer gate formed by Transistors M5 and M6, and Transistors M10 and M11 that form the portion of the driven circuit excluding Transistors M13 and M14 that form the inverter.

Figure 5:
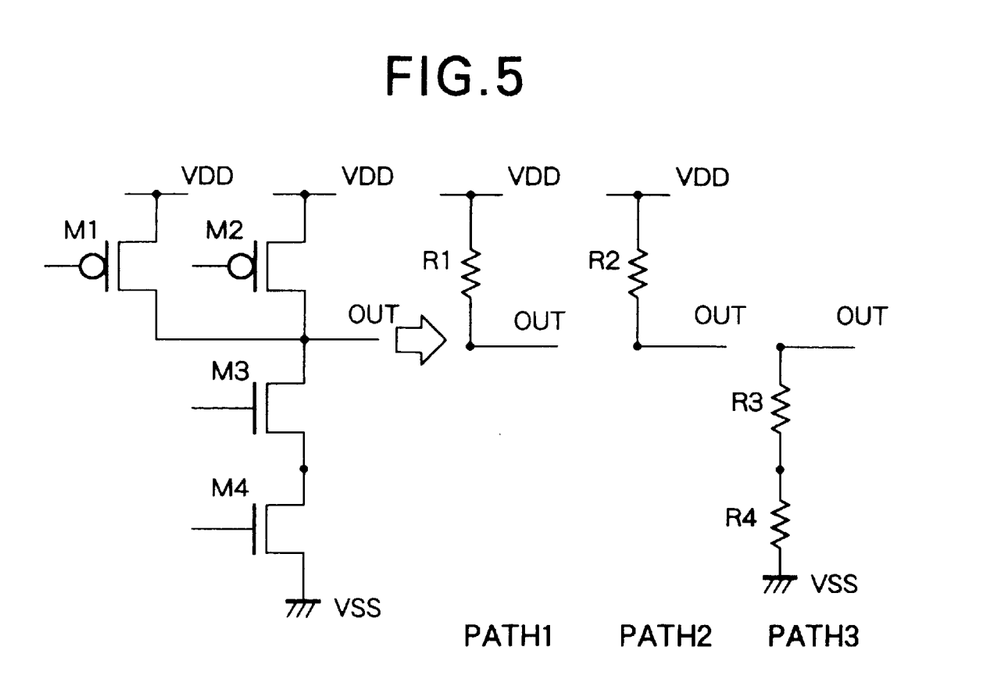
FIG. 5 is a diagram showing how a resistance is substituted for a transistor comprising the NAND gate of the partial circuit shown in FIG. 4.

Next, the maximum resistance calculating part 100 calculates the maximum resistance between Transistors M10 and M11 of the driven circuit, based on the information concerning the partial circuit network stored in the partial circuit network storing part 50 as well as using VDD or VSS during the operation of the NAND gate, which is the driver. More specifically, the maximum resistance calculating part 100 first obtains a path to VDD or VSS by tracing from the output node OUT of the NAND gate in the direction of channel, and substitutes resistances for the transistors, using the expressions (1)–(3) shown below. FIG. 5 shows how this substitution takes place.

$$R_{ON} = \frac{VDD}{I_{DO}} \quad (1)$$

$$I_{DO} = \frac{\beta}{2}(V_{GS} - V_{TH})^2 \quad (2)$$

$$\beta = \mu \cdot C_{OX} \cdot \frac{W}{L} \quad (3)$$

where $R_{ON}$ is the ON resistance of the transistor, $I_{DO}$ is the drain current of the transistor, $V_{GS}$ is the voltage between the gate and the source of the transistor, $V_{TH}$ is the threshold voltage, $\mu$ is the amount of travel of the carrier, $C_{OX}$ is the gate capacitance per unit area, W is the effective channel width, and L is the effective channel length. It should be noted here that the calculation is made on the assumption of $V_{GS}$=VDD and that the greatest value of resistance among all the paths is selected as the maximum output resistance.

Figure 6:
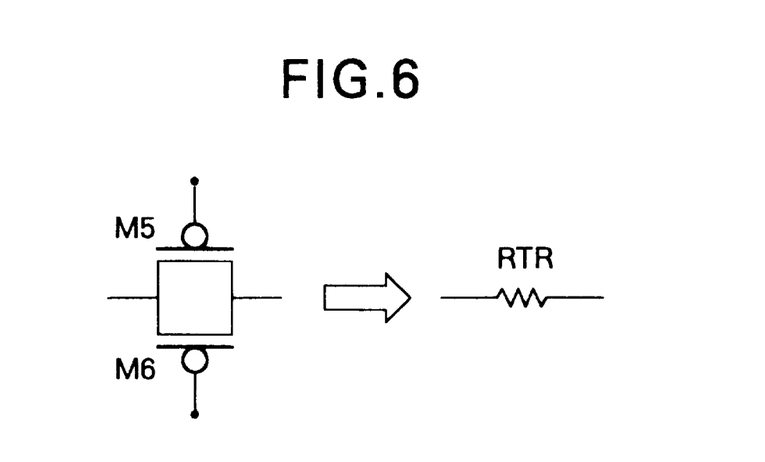
FIG. 6 is a diagram showing how a resistance is substituted for the transfer gate of the partial circuit shown in FIG. 4.

Next, the maximum resistance calculating part 100 substitutes a resistance for a transfer, using the expression (4) shown below. FIG. 6 shows how this substitution takes place.

$$R_{TR} = R_T \cdot \frac{L_{TP}}{W_{TP}} \cdot \frac{W_P}{L_P} \quad (4)$$

where $R_T$ is the ON resistance of a transfer gate of a standard size, $W_{TP}$ is the effective channel width of a PMOS of a standard size, $L_{TP}$ is the effective channel length of a PMOS of a standard size, $W_P$ is the effective channel width of a PMOS, and $L_P$ is the effective channel length of a PMOS. It is assumed here that the semiconductor has been designed using the transistor size ratio that will make the pmos and nmos that make up the transfer gate have equal driving capabilities. It is also assumed that $R_T$ is known from a SPICE simulation performed in advance.

Figure 7A:
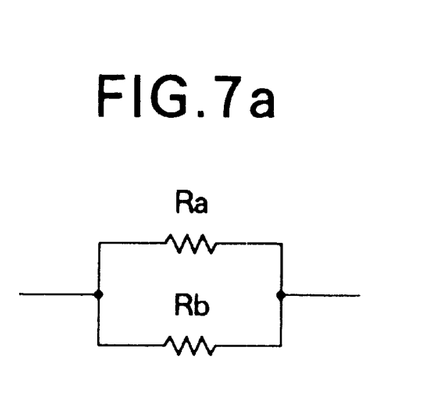
FIGS. 7a and 7b are diagrams showing how resistances are connected with each other.
Figure 7B:
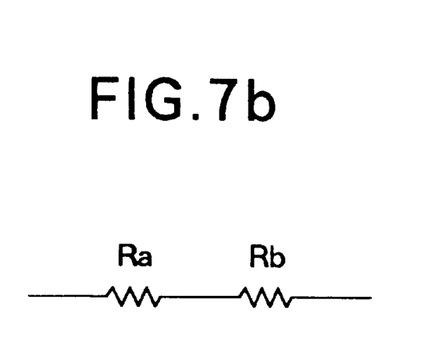

Following this, the maximum resistance calculating part 100 repeats the operation for synthesizing a resistance on the circuit formed by connecting the maximum output resistance during the operation of the NAND gate, which is the driver, the resistance of the transfer gate, and the parasitic resistances on the wiring, using the expression (5) below for cases where such circuit is connected in parallel as shown in FIG. 7(a), or using the expression (6) below for cases where such circuit is connected in series as shown in FIG. 7(b), calculates the maximum resistance $R_{MAX}$, and stores the resultant value of $R_{MAX}$ in the maximum resistance storing part 60 (Step 202).

$$R = \frac{R_1 \cdot R_2}{R_1 + R_2} \tag{5}$$

$$R = R_1 + R_2 \tag{6}$$

It is assumed here that the drains of Transistor M1, Transistor M2, and Transistor M3, which are the output nodes of the NAND gate, are one and the same node. It is also assumed that the gates of Transistor M10 and M11 of the driven circuit are one and the same node.

Next, the gate capacitance calculating part 110 calculates the capacitance $C_G$ of the gates of Transistors M10 and M11 of the driven circuit that is stored in the partial circuit network storing part 50, using the expression (7) below, and stores the total value $C_{GATE}$ in the gate capacitance storing part 70 (Step 202).

$$C_G = C_{OX} \cdot W \cdot L \tag{7}$$

where $C_{OX}$ is the gate capacitance per unit area, W is the effective channel width, and L is the effective channel length.

The error judging part 120 calculates the value of evaluation function from the information concerning the maximum resistance value $R_{MAX}$ stored in the maximum resistance storing part 60 and the information concerning the total gate capacitance $C_{GATE}$ stored in the gate capacitance storing part 70 (Step 203). The evaluation function must be determined in advance by performing a SPICE simulation.

Figure 8:
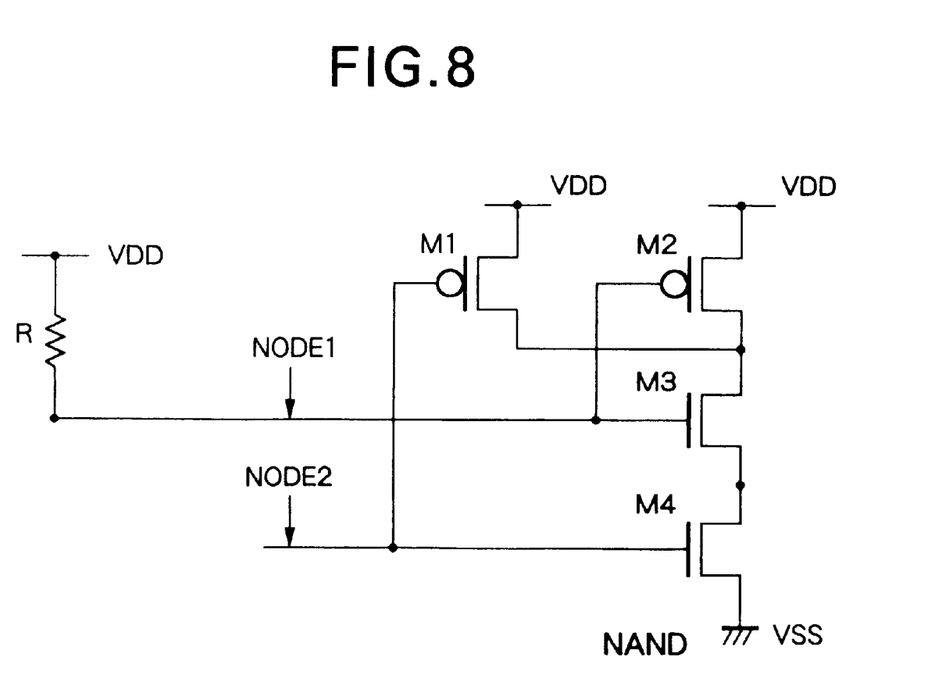
FIG. 8 is a circuit diagram showing an example of configuration of a switching noise measuring circuit used for determining an evaluation function.

FIG. 8 is a circuit diagram showing an example of configuration of a switching noise measuring circuit used for determining an evaluation function. If the voltage at Node 2 of the circuit shown in FIG. 8 is made to rise steeply, switching noise occurs at Node 1. Using this phenomenon, the level of generated switching noise is measured to determine how it is affected by changes in the level of the resistance R and the size of the transistors at the NAND gate.

Figure 9:
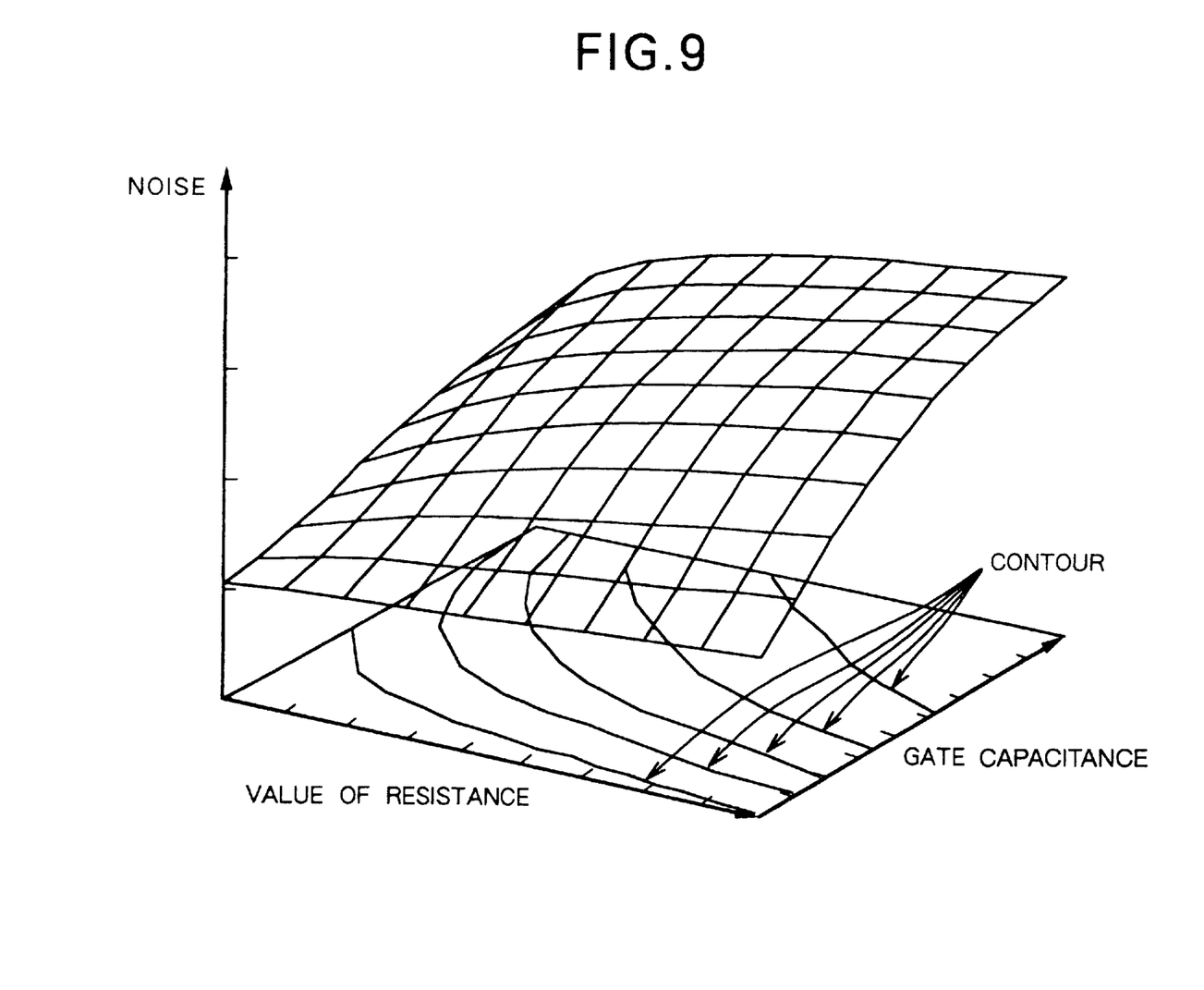
FIG. 9 is a diagram showing an example of the generation of switching noise relative to the value of resistance obtained by a SPICE simulation and to the gate capacitance.
Figure 10:
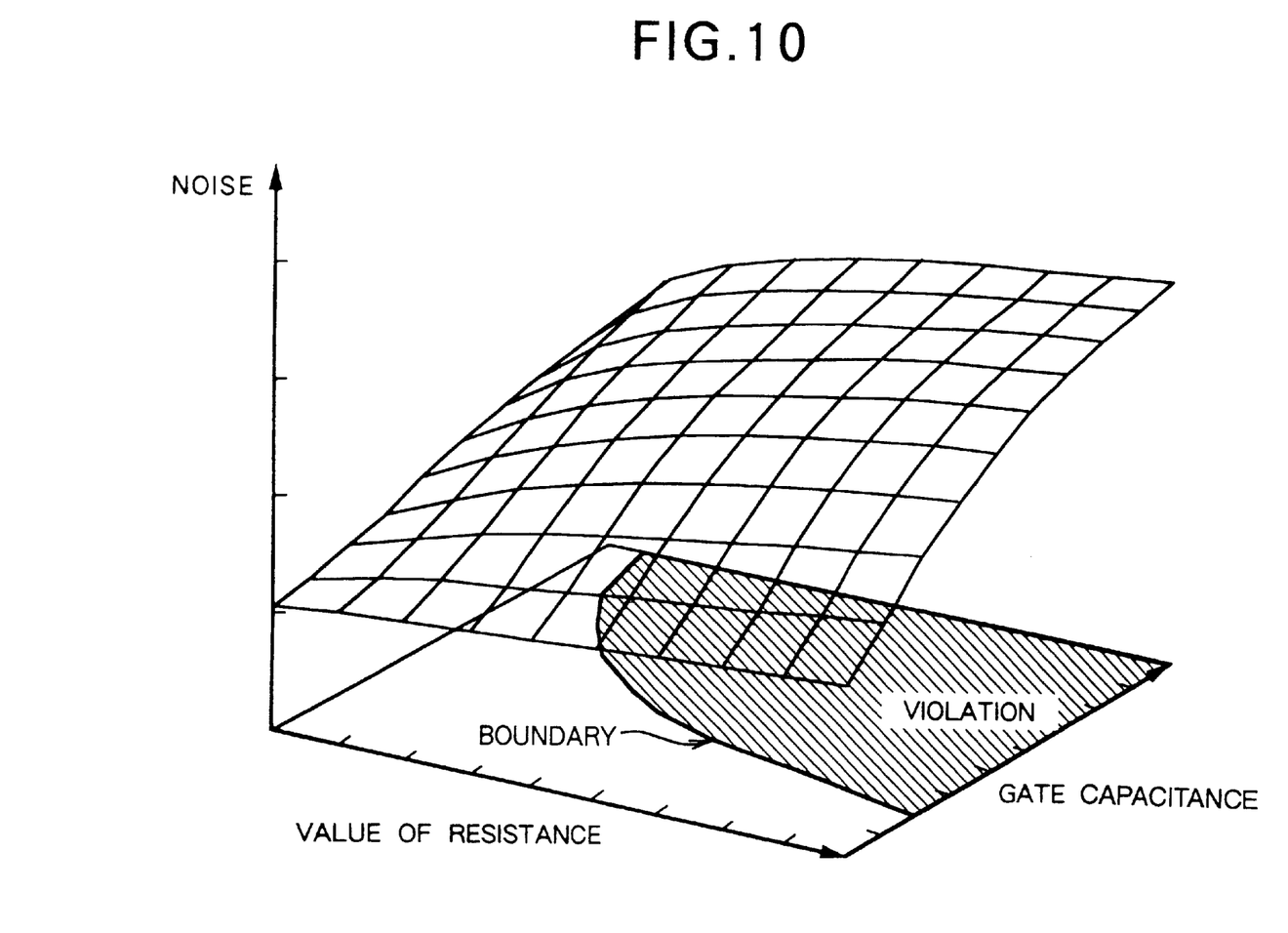
FIG. 10 is a diagram showing an example of evaluation function determined in accordance with design criteria established for reliability against switching noise.

FIG. 9 is a diagram showing an example of the generation of switching noise relative to the value of resistance obtained by performing a SPICE simulation and to the gate capacitance. FIG. 10 is a diagram showing an example of evaluation function determined in accordance with design criteria established for reliability against switching noise. If the value of resistance and the gate capacitance fall in the violation region beyond the criteria boundary shown in FIG. 10, the evaluation function returns the amount of switching noise. If they satisfy the criteria, the evaluation function returns "0".

The error judging part 120 judges whether or not the value of evaluation function obtained as described above is in violation of the design criteria (Step 204), and if it is, the error judging part 120 stores the information concerning the partial circuit network and the information concerning the value of evaluation function and the total gate capacitance in the verification result storing part 80 (Step 205).

After performing the verification process described above on all the partial circuits to be verified, the output device 30 outputs the information stored in the verification result storing part 80, i.e., the information concerning the partial circuit network in violation of the design criteria against switching noise and the information concerning the value of evaluation function, the value of maximum resistance, and the total gate capacitance (Steps 206 and 207).

Thus, by using a reliability verification device of the present embodiment, it is possible to identify in a comprehensive manner the portions of design that may cause a semiconductor integrated circuit to be verified to malfunction under the influence of switching noise, and by reflecting the results in modifying the design as appropriate, it is further possible to design a highly reliable semiconductor integrated circuit that will not malfunction under the influence of switching noise.

As described in the foregoing, a semiconductor integrated circuit reliability verification device according to the present invention and its verification method extract partial circuit networks from a semiconductor integrated circuit to be verified, and verify its reliability against switching noise on a partial-circuit-network-to- partial-circuit-network basis. Thus, it is possible to perform verification exhaustively and accurately however large in size the subject circuit is. In addition, since each partial circuit networks is small in size, the calculation of the maximum resistance and the gate capacitance and the judgment of errors are both relatively simple processes, allowing all the necessary processes to be executed quite fast. This leads to another effect that, in designing a large-scale semiconductor integrated circuit, the portions of design that may cause malfunction under the influence of switching noise can be detected in a fast and comprehensive manner.

A further effect of a reliability verification device of the present invention and its verification method is that, unlike conventional simulation-based verification methods, there is no necessity of preparing a test pattern to be used on design information and setting relevant expected values, thereby reducing labor required for the verification process.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A semiconductor integrated circuit reliability verification device for examining transistor-level design information on a circuit to be verified to detect any portion of the design that may cause circuit malfunction due to the effects of switching noise, comprising:

partial circuit network detecting means for detecting information concerning partial circuit networks that form part of a circuit to be verified, based on information equivalent to a transistor-level net list for the circuit to be verified;

maximum resistance calculating means for calculating the maximum resistance that occurs while the channel connected component, which is the driver, is operating, based on the information concerning said partial circuit network detected by said partial circuit network detecting means;

gate capacitance calculating means for calculating the total gate capacitance for the portions but the inverter of a driven circuit driven by said driver, based on the information concerning said partial circuit network detected by said partial circuit network detecting means; and error judging means for calculating the value of evaluation function, based on said value of maximum resistance calculated by said maximum resistance calculating means and said total gate capacitance calculated by said gate capacitance calculating means, and judging whether or not said calculated value is in violation of the pre-established design criteria.

2. The semiconductor integrated circuit reliability verification device as set forth in claim 1, wherein said partial circuit network detecting means at least detects from design information on said verified circuit, as information concerning a partial circuit network, information concerning connection relationship between transistors that form said channel connected component and transistors that form the circuit portion but the inverter of the driven circuit as well as concerning parasitic resistances on the wiring that connects such transistors.

3. The semiconductor integrated circuit reliability verification device as set forth in claim 1, wherein said maximum resistance calculating means substitutes for resistances the transistors that form said channel connected component of said partial circuit network, and calculates the maximum value of resistance by synthesizing such resistances and said parasitic resistances on said wiring.

4. The semiconductor integrated circuit reliability verification device as set forth in claim 1, wherein, said partial circuit network detecting means at least detects from design information on said verified circuit, as information concerning a partial circuit network, information concerning connection relationship between transistors that form said channel connected component and transistors that form the circuit portion but the inverter of the driven circuit as well as concerning parasitic resistances on the wiring that connects such transistors, and said maximum resistance calculating means substitutes for resistances the transistors that form said channel connected component of said partial circuit network, and calculates the maximum value of resistance by synthesizing such resistances and said parasitic resistances on said wiring.

5. The semiconductor integrated circuit reliability verification device as set forth in claim 1, wherein, said circuit to be verified is a synchronous circuit of CMOS.

6. A semiconductor integrated circuit reliability verification method for examining transistor-level design information on a circuit to be verified to detect any portion of the design that may cause circuit malfunction due to the effects of switching noise, comprising the steps of:

detecting information concerning partial circuit networks that form part of a circuit to be verified, based on information equivalent to a transistor-level net list for the circuit to be verified;

calculating the maximum resistance that occurs while the channel connected component, which is the driver, is operating, based on the information concerning said partial circuit network thus detected;

calculating the total gate capacitance for the portions but the inverter of a driven circuit driven by said driver, based on the information concerning said partial circuit network thus detected; and calculating the value of evaluation function, based on said value of maximum resistance and said total gate capacitance thus calculated, and judging whether or not said calculated value is in violation of the pre-established design criteria.

7. The semiconductor integrated circuit reliability verification method as set forth in claim 6, wherein said partial circuit network detecting step at least detects from design information on said verified circuit, as information concerning a partial circuit network, information concerning connection relationship between transistors that form said channel connected component and transistors that form the circuit portion but the inverter of the driven circuit as well as concerning parasitic resistances on the wiring that connects such transistors.

8. The semiconductor integrated circuit reliability verification method as set forth in claim 6, wherein said maximum resistance calculating step further comprising steps of substituting for resistances the transistors that form said channel connected component of said partial circuit network, and calculating the maximum value of resistance by synthesizing such resistances and said parasitic resistances on said wiring.

9. The semiconductor integrated circuit reliability verification method as set forth in claim 6, wherein said partial circuit network detecting step at least detects from design information on said verified circuit, as information concerning a partial circuit network, information concerning connection relationship between transistors that form said channel connected component and transistors that form the circuit portion but the inverter of the driven circuit as well as concerning parasitic resistances on the wiring that connects such transistors, and said maximum resistance calculating step further comprising steps of substituting for resistances the transistors that form said channel connected component of said partial circuit network, and calculating the maximum value of resistance by synthesizing such resistances and said parasitic resistances on said wiring.

10. The semiconductor integrated circuit reliability verification method as set forth in claim 6, wherein said circuit to be verified is a synchronous circuit of CMOS.

11. A computer readable memory storing a verification program that controls the operation of a semiconductor integrated circuit reliability verification device for examining transistor-level design information on a circuit to be verified to detect any portion of the design that may cause circuit malfunction due to the effects of switching noise, wherein said verification program comprising the steps of:

detecting information concerning partial circuit networks that form part of a circuit to be verified, based on information equivalent to a transistor-level net list for the circuit to be verified;

calculating the maximum resistance that occurs while the channel connected component, which is the driver, is operating, based on the information concerning said partial circuit network thus detected;

calculating the total gate capacitance for the portions but the inverter of a driven circuit driven by said driver, based on the information concerning said partial circuit network thus detected; and calculating the value of evaluation function, based on said value of maximum resistance and said total gate capacitance thus calculated, and judging whether or not said calculated value is in violation of the pre-established design criteria.

12. The computer readable memory as set forth in claim 11, wherein said partial circuit network detecting step at least detects from design information on said verified circuit, as information concerning a partial circuit network, information concerning connection relationship between transistors that form said channel connected component and transistors that form the circuit portion but the inverter of the driven circuit as well as concerning parasitic resistances on the wiring that connects such transistors.

13. The computer readable memory as set forth in claim 11, wherein said maximum resistance calculating step further comprising steps of substituting for resistances the transistors that form said channel connected component of said partial circuit network, and calculating the maximum value of resistance by synthesizing such resistances and said parasitic resistances on said wiring.

14. The computer readable memory as set forth in claim 11, wherein said partial circuit network detecting step at least detects from design information on said verified circuit, as information concerning a partial circuit network, information concerning connection relationship between transistors that form said channel connected component and transistors that form the circuit portion but the inverter of the driven circuit as well as concerning parasitic resistances on the wiring that connects such transistors, and said maximum resistance calculating step further comprising steps of substituting for resistances the transistors that form said channel connected component of said partial circuit network, and calculating the maximum value of resistance by synthesizing such resistances and said parasitic resistances on said wiring.

15. The computer readable memory as set forth in claim 11, wherein said circuit to be verified is a synchronous circuit of CMOS.

* * * * *